United States Patent
Takatsuki et al.

(10) Patent No.: US 11,387,112 B2
(45) Date of Patent: Jul. 12, 2022

(54) SURFACE PROCESSING METHOD AND PROCESSING SYSTEM

(71) Applicant: TOKYO ELECTRON LIMITED, Tokyo (JP)

(72) Inventors: Koichi Takatsuki, Nirasaki (JP); Tadahiro Ishizaka, Nirasaki (JP); Mikio Suzuki, Nirasaki (JP); Toshio Hasegawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 109 days.

(21) Appl. No.: 16/587,760

(22) Filed: Sep. 30, 2019

(65) Prior Publication Data

US 2020/0111675 A1 Apr. 9, 2020

(30) Foreign Application Priority Data

Oct. 4, 2018 (JP) .............................. JP2018-189432
Jun. 7, 2019 (JP) .............................. JP2019-107422

(51) Int. Cl.
| | |
|---|---|
| *H01L 21/311* | (2006.01) |
| *H01L 21/285* | (2006.01) |
| *C23C 16/455* | (2006.01) |
| *C23C 16/02* | (2006.01) |
| *C23C 16/06* | (2006.01) |
| *H01L 21/768* | (2006.01) |

(52) U.S. Cl.
CPC .... *H01L 21/31122* (2013.01); *C23C 16/0236* (2013.01); *C23C 16/06* (2013.01); *C23C 16/45525* (2013.01); *H01L 21/28556* (2013.01); *H01L 21/76877* (2013.01)

(58) Field of Classification Search
None
See application file for complete search history.

(56) References Cited

U.S. PATENT DOCUMENTS

| 6,844,258 | B1 * | 1/2005 | Fair .................. H01L 21/76849 257/650 |
| 9,449,843 | B1 * | 9/2016 | Korolik .................... C23F 1/12 |
| 9,589,836 | B1 * | 3/2017 | Zhang ............... H01L 21/76877 |
| 2002/0155722 | A1 * | 10/2002 | Satta ................. H01L 23/53252 438/704 |
| 2006/0252252 | A1 * | 11/2006 | Zhu ..................... C23C 16/0227 438/618 |
| 2011/0165780 | A1 * | 7/2011 | Kanjolia ........... C23C 16/45525 438/785 |

(Continued)

FOREIGN PATENT DOCUMENTS

| JP | H6-224150 A | 8/1994 |
| JP | H7-22416 A | 1/1995 |

(Continued)

*Primary Examiner* — Erik T. K. Peterson
(74) *Attorney, Agent, or Firm* — Nath, Goldberg & Meyer; Jerald L. Meyer; Tanya E. Harkins

(57) ABSTRACT

There is provided a method of performing a surface processing on a substrate having a metal layer formed on a bottom portion of a recess formed in an insulating film, the method including: supplying a halogen-containing gas into a processing chamber in which the substrate is loaded; and removing a metal oxide from the bottom portion of the recess using the halogen-containing gas.

11 Claims, 8 Drawing Sheets

(56) References Cited

U.S. PATENT DOCUMENTS

| | | | | |
|---|---|---|---|---|
| 2015/0279735 A1* | 10/2015 | Hotta | ............... | H01L 21/28556 |
| | | | | 438/656 |
| 2016/0379870 A1* | 12/2016 | Clark | ............... | H01L 21/31144 |
| | | | | 438/694 |
| 2017/0110368 A1* | 4/2017 | Yu | ................... | H01L 21/76826 |
| 2017/0148670 A1* | 5/2017 | Lei | ........................ | C23C 16/54 |
| 2017/0243827 A1* | 8/2017 | Simon | ............... | H01L 21/76877 |
| 2018/0096847 A1* | 4/2018 | Thompson | ........ | H01L 21/76883 |
| 2018/0130657 A1* | 5/2018 | Duan | ............... | H01L 21/76897 |
| 2018/0130671 A1* | 5/2018 | Duan | ............... | H01L 21/02175 |
| 2018/0166255 A1* | 6/2018 | Blomberg | ............. | C09K 13/00 |
| 2018/0182597 A1* | 6/2018 | Blomberg | ........ | H01J 37/32009 |
| 2018/0223437 A1* | 8/2018 | George | ................. | C09K 13/08 |
| 2018/0254181 A1* | 9/2018 | Ishizaka | ............. | H01L 21/0262 |
| 2018/0347041 A1* | 12/2018 | Kim | ................. | C23C 16/45534 |
| 2019/0164817 A1* | 5/2019 | Khaderbad | ....... | H01L 29/41791 |
| 2019/0214296 A1* | 7/2019 | Wang | ............... | H01L 21/76879 |
| 2019/0273019 A1* | 9/2019 | Mullick | ............ | H01L 21/32134 |
| 2020/0048762 A1* | 2/2020 | Ke | .................... | H01L 21/76826 |
| 2020/0090991 A1* | 3/2020 | Yu | ................... | H01L 21/76847 |
| 2020/0303250 A1* | 9/2020 | Cen | .................. | H01L 21/02068 |
| 2020/0343136 A1* | 10/2020 | Yu | ................... | H01L 21/76879 |

FOREIGN PATENT DOCUMENTS

| | | |
|---|---|---|
| JP | 08-107144 A | 4/1996 |
| JP | H9-321006 A | 12/1997 |
| KR | 1020150112863 A | 10/2015 |
| KR | 1020180005607 A | 1/2018 |
| KR | 1020180018413 A | 2/2018 |

\* cited by examiner

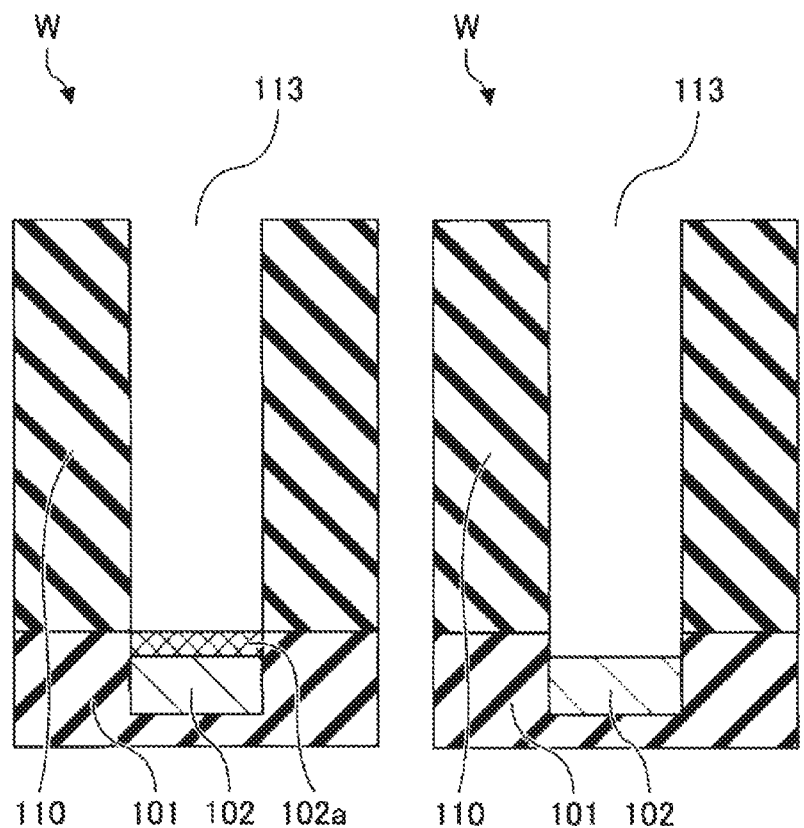

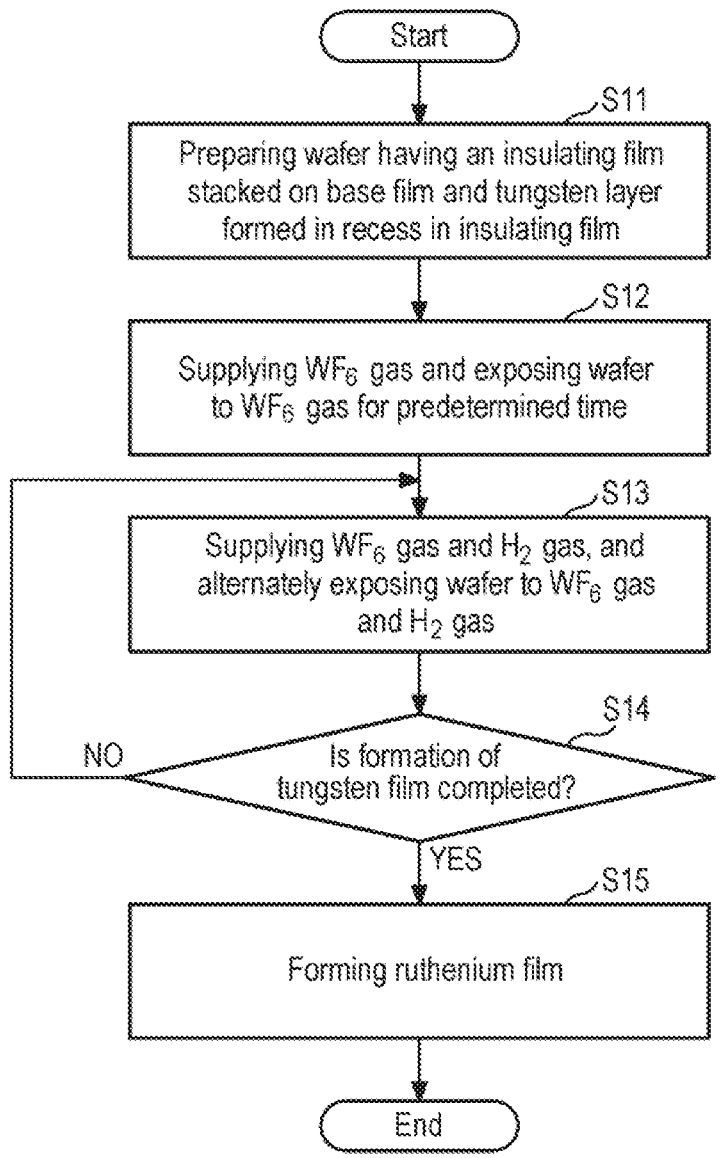

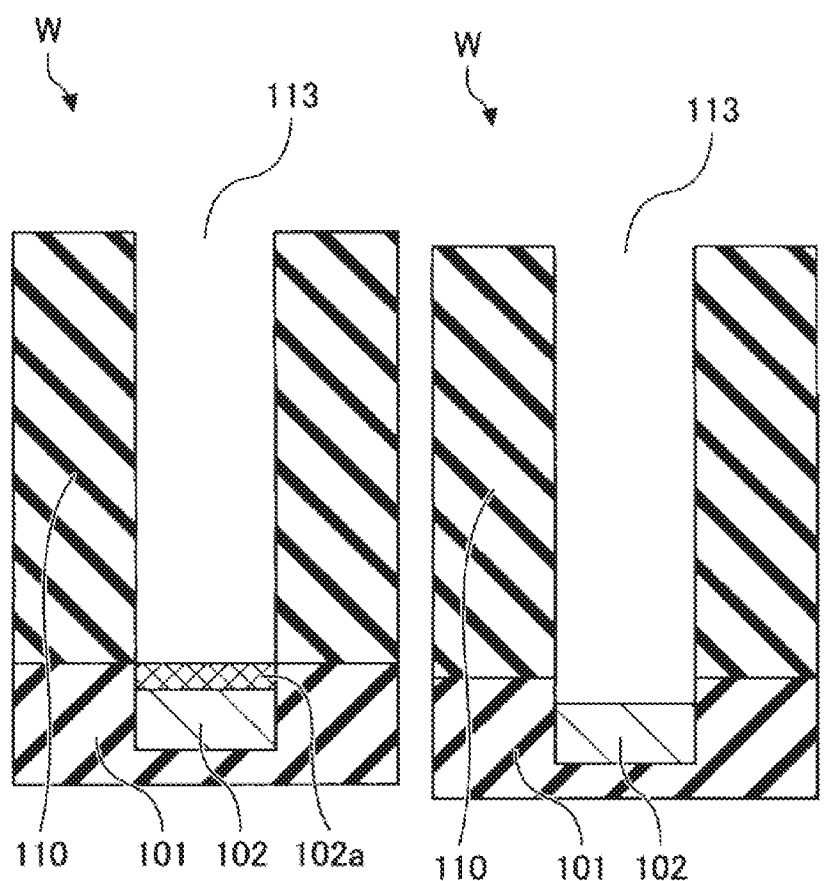

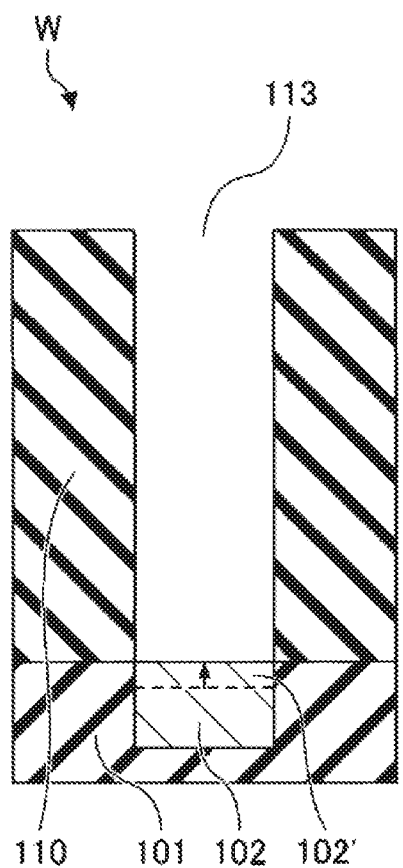
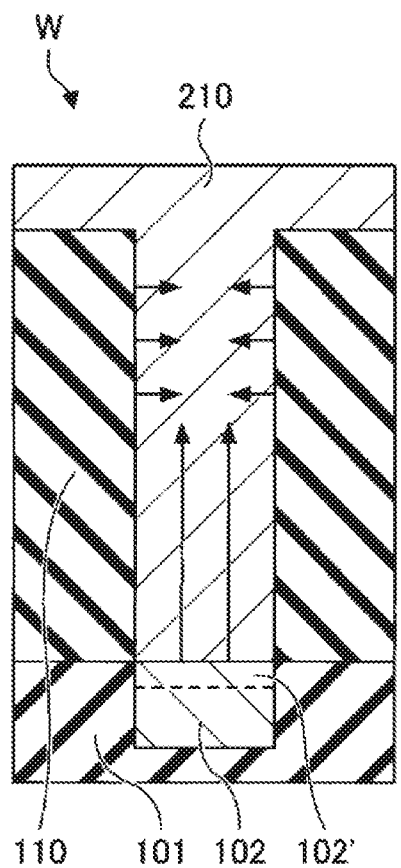

SURFACE PROCESSING METHOD AND PROCESSING SYSTEM

CROSS-REFERENCE TO RELATED APPLICATIONS

This application is based upon and claims the benefit of priority from Japanese Patent Application Nos. 2018-189432 and 2019-107422, filed on Oct. 4, 2018, and Jun. 7, 2019, respectively, the entire contents of which are incorporated herein by reference.

TECHNICAL FIELD

The present disclosure relates to a surface processing method and a processing system.

BACKGROUND

For example, Patent Documents 1 to 3 disclose processes of removing a natural oxide film produced when a metal of a contact member and a surface of a silicon film of a wiring layer are naturally oxidized during semiconductor manufacturing.

PRIOR ART DOCUMENT

Patent Documents

Japanese Laid-Open Patent Publication No. H6-224150
Japanese Laid-Open Patent Publication No. H7-22416
Japanese Laid-Open Patent Publication No. H9-321006

SUMMARY

According to an embodiment of the present disclosure, there is provided a method of performing a surface processing on a substrate having a metal layer formed on a bottom portion of a recess formed in an insulating film, the method including: supplying a halogen-containing gas into a processing chamber in which the substrate is loaded; and removing a metal oxide from the bottom portion of the recess using the halogen-containing gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A to 5C are schematic cross-sectional views of a wafer, illustrating respective steps of a surface processing and a film forming method according to an embodiment.

FIG. 6 is a flowchart illustrating an example of a surface processing according to a modification of an embodiment.

FIGS. 7A to 7D are schematic cross-sectional views of a wafer, illustrating respective steps of a surface processing and a film forming method according to a modification of an embodiment.

DETAILED DESCRIPTION

Figure 1:
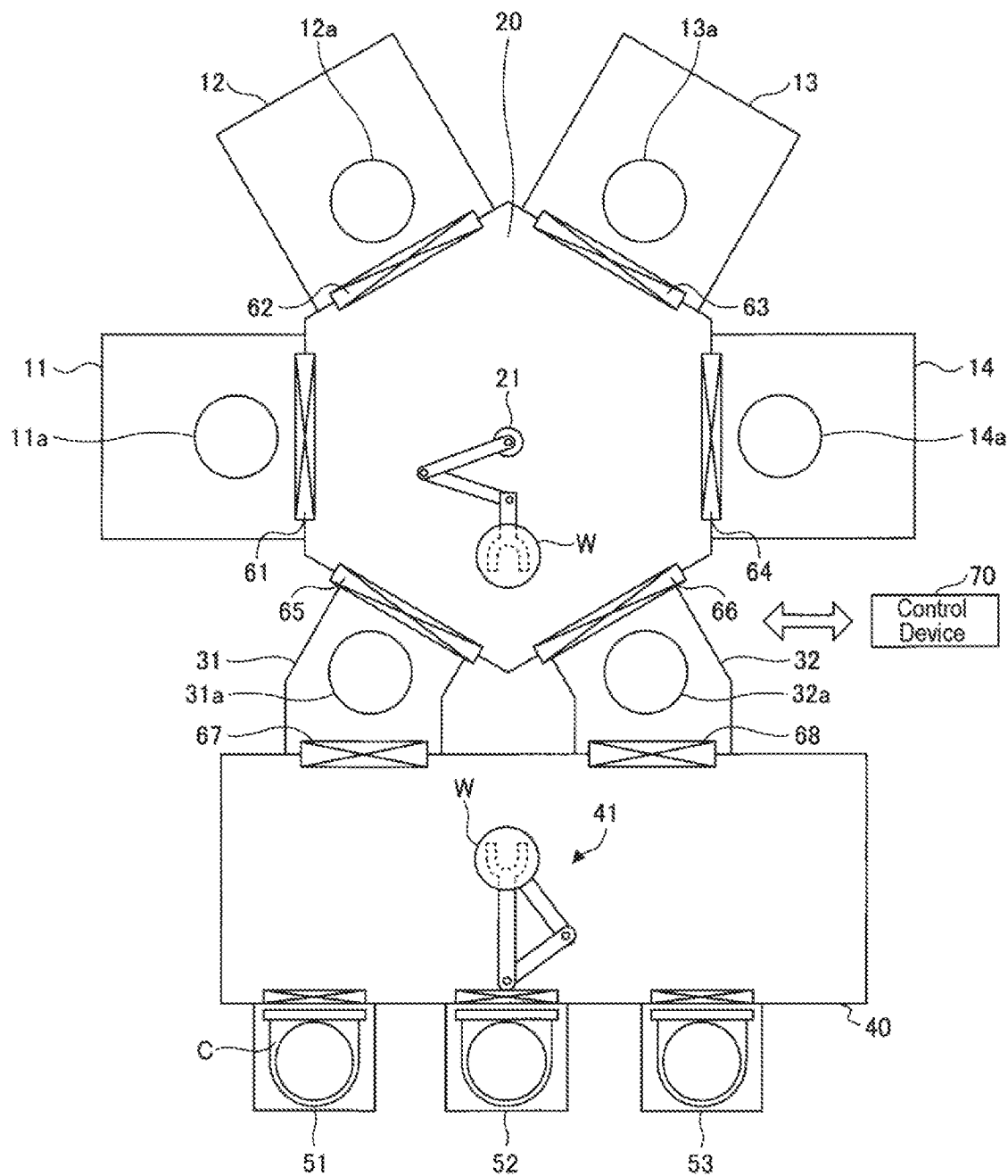
FIG. 1 is a schematic plan view illustrating an example of a processing system used for a surface processing method according to an embodiment.

Hereinafter, embodiments of the present disclosure will be described with reference to the accompanying drawings. In each of the drawings, the same components are denoted by the same reference numerals, and redundant descriptions may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When a metal film of tungsten or the like is exposed from the bottom portion of a recess, such as a trench, a via hole, a contact hole or the like, which is formed in an insulating film such as a silicon oxide film, a surface of the metal film is naturally oxidized to form a metal oxide film. In this state, when a metal film (e.g., a ruthenium film) is embedded in the recess to form a ruthenium wiring layer, contact resistance due to the metal oxide film is increased.

Therefore, in order to reduce the contact resistance value, the ruthenium film is embedded in the recess after removing the metal oxide film. In an etching process of removing the metal oxide film, in order to avoid the shape of the recess of the insulating film from being changed, a condition for not etching the insulating film is required. Thus, the present embodiment provides a surface processing method and a processing system which are capable of removing a metal oxide film with high selectivity. That is, the present disclosure provides a surface processing technique capable of removing a metal oxide film with high selectivity without etching the insulating film by setting an etching rate of the metal oxide film to be higher than that of the insulating film having the recess by a predetermined level.

<Processing System>

First, a processing system used for a surface processing method according to an embodiment will be described with reference to FIG. 1. FIG. 1 is a schematic plan view illustrating an example of the processing system used for the surface processing method according to an embodiment.

The processing system includes processing chambers 11 to 14, a vacuum transfer chamber 20, load-lock chambers 31 and 32, an atmospheric transfer chamber 40, load ports 51 to 53, gate valves 61 to 68, and a control device 70.

The processing chamber 11 includes a stage 11a configured to place a semiconductor wafer W (hereinafter, referred to as a "wafer W") thereon, and is connected to the vacuum transfer chamber 20 via a gate valve 61. Similarly, the processing chamber 12 includes a stage 12a configured to place the wafer W thereon, and is connected to the vacuum transfer chamber 20 via a gate valve 62. The processing chamber 13 includes a stage 13a configured to place the wafer W thereon, and is connected to the vacuum transfer chamber 20 via a gate valve 63. The processing chamber 14 includes a stage 14a configured to place the wafer W thereon, and is connected to the vacuum transfer chamber 20 via a gate valve 64. The interior of each of the processing chambers 11 to 14 is depressurized to a predetermined vacuum atmosphere such that a predetermined process (e.g., an etching process, a film forming process, a cleaning process, an ashing process or the like) is performed on the respective wafer W in the interior of the respective processing chamber. The operation of each part for the respective processes in the processing chambers 11 to 14 is controlled by the control device 70.

The interior of the vacuum transfer chamber 20 is depressurized to a predetermined vacuum atmosphere. In addition, a transfer mechanism 21 is provided in the vacuum transfer chamber 20. The transfer mechanism 21 transfers the wafer W between the processing chambers 11 to 14, and the load-lock chambers 31 and 32. The operation of the transfer mechanism 21 is controlled by the control device 70.

The load-lock chamber 31 has a stage 31a configured to place the wafer W thereon, and is connected to the vacuum transfer chamber 20 via the gate valve 65 and to the atmospheric transfer chamber 40 via the gate valve 67. Similarly, the load-lock chamber 32 has a stage 32a configured to place the wafer W thereon, and is connected to the vacuum transfer chamber 20 via the gate valve 66 and to the atmospheric transfer chamber 40 via the gate valve 68. Each of the load-lock chambers 31 and 32 is configured such that the interior thereof is switched between an air atmosphere and a vacuum atmosphere. In addition, the switching of the interior of each of the load-lock chambers 31 and 32 between the vacuum atmosphere and the air atmosphere is controlled by the control device 70.

The interior of the atmospheric transfer chamber 40 is set to be the air atmosphere. For example, a down-flow of clean air is formed inside the atmospheric transfer chamber 40. In addition, the vacuum transfer chamber 40 is provided with a transfer mechanism 41. The transfer mechanism 41 transfers the wafer W between the load-lock chambers 31 and 32, and a carrier C in each of the load ports 51 to 53, as will be described later. The operation of the transfer mechanism 41 is controlled by the control device 70.

The load ports 51 to 53 are provided in the wall of a long side of the atmospheric transfer chamber 40. The carrier C in which the wafers W are accommodated or an empty carrier C is mounted in each of the load ports 51 to 53. A front opening unified pod (FOUP) may be used as the carrier C.

The gate valves 61 to 68 are configured to be openable/closable. In addition, the opening/closing of each of the gate valves 61 to 68 is controlled by the control device 70.

The control device 70 controls the entire processing system by controlling the operations of the processing chambers 11 to 14, the operations of the transfer mechanisms 21 and 41, the opening/closing of each of the gate valves 61 to 68, the switching of the interior of each of the load-lock chambers 31 and 32 between the vacuum atmosphere and the air atmosphere, and the like.

Next, an example of the operation of the processing system will be described. For example, the control device 70 opens the gate valve 67 and controls the transfer mechanism 41 to transfer the wafer W accommodated in, for example, the carrier C in the load port 51 to the stage 31a of the load-lock chamber 31. The control device 70 closes the gate valve 67 to set the interior of the load-lock chamber 31 to a vacuum atmosphere.

The control device 70 opens the gate valves 61 and 65, and controls the transfer mechanism 21 to transfer the wafer W in the load-lock chamber 31 to the stage 11a of the processing chamber 11. The control device 70 closes the gate valves 61 and 65, and operates the processing chamber 11. Thus, a predetermined process (e.g., a metal oxide film removal process to be described later) is performed on the wafer W inside the processing chamber 11.

Subsequently, the control device 70 opens the gate valves 61 and 63 and controls the transfer mechanism 21 to transfer the wafer W processed inside the processing chamber 11 to the stage 13a of the processing chamber 13. The control device 70 closes the gate valves 61 and 63, and operates the processing chamber 13. Thus, a predetermined process (e.g., a ruthenium embedding process to be described later) is performed on the wafer W inside the processing chamber 13.

The control device 70 may transfer the wafer W processed in the processing chamber 11 to the stage 14a of the processing chamber 14 in which a process similar to the process in the processing chamber 13 is capable of being performed. In the present embodiment, the wafer W in the processing chamber 11 is transferred to the processing chamber 13 or the processing chamber 14 depending on the operation states of the processing chamber 13 and the processing chamber 14. With this configuration, it is possible for the control device 70 to perform the predetermined process (e.g., the ruthenium embedding process to be described later) on the plurality of wafers W in parallel using the processing chamber 13 and the processing chamber 14. This makes it possible to improve productivity.

The control device 70 controls the transfer mechanism 21 to transfer the wafer W processed in the processing chamber 13 or 14 to the stage 31a of the load-lock chamber 31 or the stage 32a of the load-lock chamber 32. The control device 70 sets the interior of the load-lock chamber 31 or the load-lock chamber 32 to an air atmosphere. The control device 70 opens the gate valve 67 or the gate valve 68, and controls the transfer mechanism 41 to transfer the wafer W in the load-lock chamber 32 to, for example, the carrier C in the load port 53, to be accommodated in the carrier C.

As described above, with the processing system illustrated in FIG. 1, while the wafers W are being processed in the respective processing chambers, it is possible to perform a predetermined surface processing on each wafer W without exposing the wafers W to the air, namely without breaking the vacuum.

<Processing Apparatus>

Figure 2:
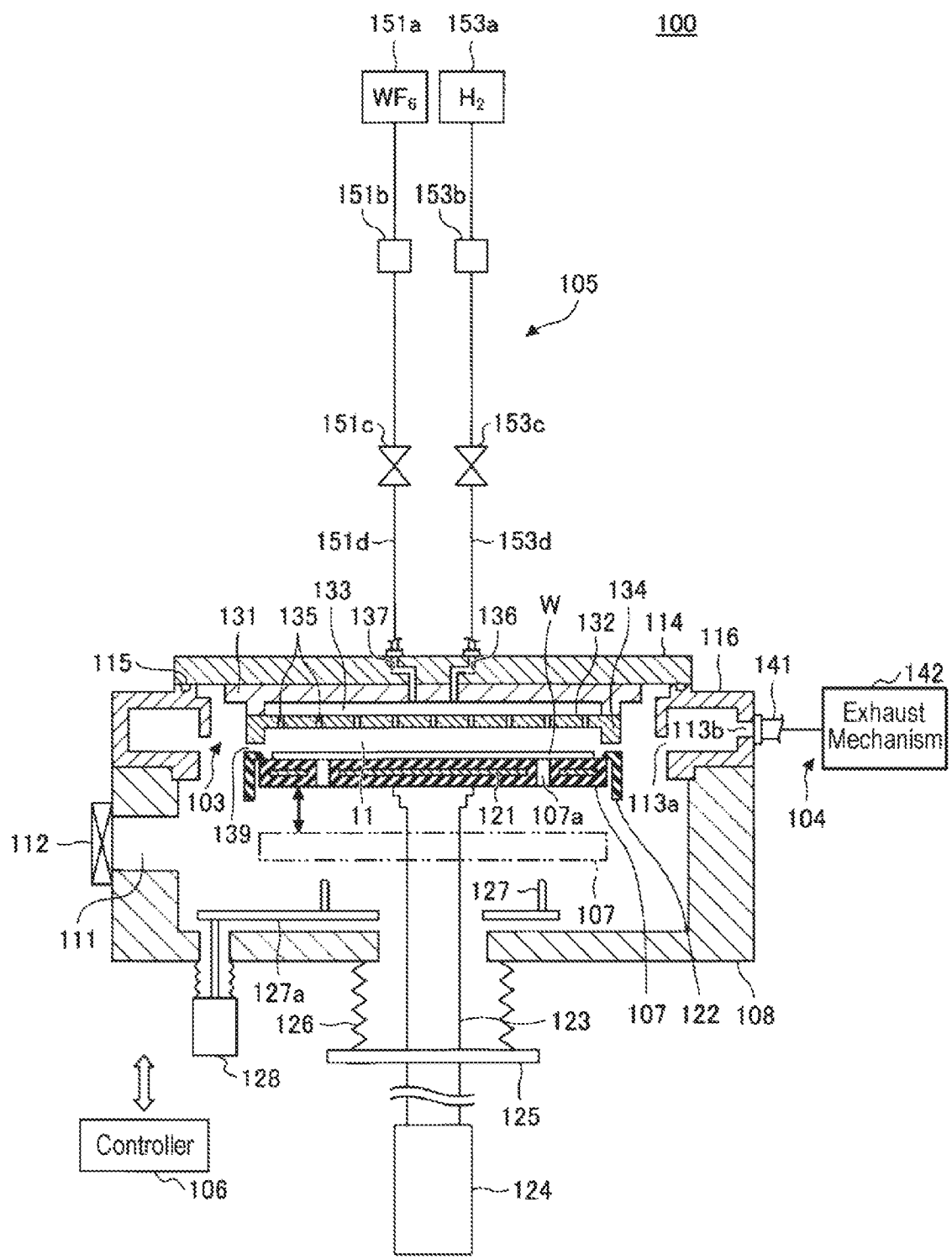
FIG. 2 is a vertical cross-sectional view illustrating an example of a processing chamber used for the surface processing method according to an embodiment.

Next, an exemplary configuration of a processing apparatus 100 for providing the processing chambers 11 to 14 used for the surface processing method according to an embodiment will be described with reference to FIG. 2. FIG. 2 is a schematic cross-sectional view of an example of the processing apparatus 100. The processing apparatus 100 illustrated in FIG. 2 removes a metal oxide film using the reaction of gas. In the processing apparatus 100, no plasma is used for etching. For example, the processing apparatus 100 supplies a halogen-containing gas into the processing chamber to remove a tungsten oxide film, which is an example of the metal oxide film. The tungsten oxide film is an example of a natural oxide film formed on a surface layer of a metal layer formed of tungsten. Hereinafter, the processing apparatus 100 used for the processing chamber 11 will be described as an example.

The processing apparatus 100 includes a processing container 108, a stage 107, a shower head 103, an exhauster 104, a gas supply mechanism 105, and a controller 106. The processing container 108 is made of a metal such as aluminum, and has a substantially cylindrical shape. The processing container 108 accommodates a semiconductor wafer (hereinafter, referred to as a "wafer W") which is an example of a substrate to be processed. A loading/unloading port 111 through which the wafer W is loaded and unloaded is formed in the sidewall of the processing container 108, and is opened/closed by a gate valve 112. An annular exhaust duct 116 having a rectangular cross section is provided on a main body of the processing container 108. The exhaust duct 116 has a slit 113*a* formed along the inner peripheral surface thereof. An exhaust port 113*b* is formed in an outer wall of the exhaust duct 116. A ceiling wall 114 is provided on the exhaust duct 116 so as to close an upper opening of the processing container 108. The exhaust duct 116 and the ceiling wall 114 is hermetically sealed from each other with a seal ring 115.

The stage 107 horizontally supports the wafer W inside the processing container 108. The stage 107 is formed in a disk shape having a size corresponding to the wafer W. The stage 107 is formed of a ceramic material, such as aluminum nitride (AlN), or a metal material, such as aluminum or nickel alloy. A heater 121 is embedded in the stage 107 so as to heat the wafer W. The heater 121 generates heat with power provided from a heater power supply (not illustrated). Then, the temperature of the wafer W is controlled to a predetermined temperature by controlling the output of the heater 121 based on a temperature signal provided from a thermocouple (not illustrated) installed in the vicinity of an upper surface of the stage 107. A cover member 122 formed of ceramic such as alumina is provided in the stage 107 so as to cover an outer peripheral area of the upper surface of the stage 107 and a side surface thereof.

A support member 123 is provided on a lower surface of the stage 107 to support the stage 107. The support member 123 extends downward of the processing container 108 from the center of the lower surface of the stage 107 through a hole formed in a bottom wall of the processing container 108. A lower end of the support member 123 is connected to a lifting mechanism 124. The stage 107 is moved upward and downward between a processing position illustrated in FIG. 2 and a transfer position as indicated by a dashed double-dotted line below the processing position via the support member 123 by the lifting mechanism 124. The wafer W can be transferred at the transfer position. A flange 125 is mounted on the support member 123 below the processing container 108. A bellows 126 configured to isolate an internal atmosphere of the processing container 108 from ambient air, is provided between the bottom surface of the processing container 108 and the flange 125. The bellows 126 expands and contracts with the upward-downward movement of the stage 107.

Three wafer support pins 127 (only two are illustrated) that protrude upward from a lifting plate 127*a* are provided in the vicinity of the bottom surface of the processing container 108. The wafer support pins 127 are moved upward and downward via the lifting plate 127*a* by a lifting mechanism 128 provided below the processing container 108. The wafer support pins 127 are inserted into respective through holes 107*a* formed in the stage 107 when the stage 107 is located at the transfer position, and are configured to be moved upward and downward on the upper surface of the stage 107. By moving upward and downward the wafer support pins 127, the wafer W is transferred between a wafer transfer mechanism (not illustrated) and the stage 107.

The shower head 103 supplies a processing gas into the processing container 108 in the form of a shower. The shower head 103 is made of a metal, and is provided to face the stage 107. The shower head 3 has a diameter substantially equal to that of the stage 107. The shower head 103 includes a main body 131 fixed to the ceiling wall 114 of the processing container 108 and a shower plate 132 connected to a lower portion of the main body 131. A gas diffusion space 133 is formed between the main body 131 and the shower plate 132. Gas introduction holes 136 and 137 formed to penetrate through the center of the main body 131 and the ceiling wall 114 of the processing container 108 are connected to the gas diffusion space 133. A protruded portion 134 annularly protruding downward is formed on a peripheral edge of the shower plate 132. Gas ejection holes 135 are formed in a flat surface inward of the protruded portion 134. In the state in which the stage 107 is located at the processing position, the processing chamber 11 is formed between the stage 107 and the shower plate 132. An upper surface of the cover member 122 and the protruded portion 134 are close to each other so as to form an annular gap 139.

The exhaust part 104 exhausts the interior of the processing container 108. The exhaust part 104 includes an exhaust pipe 141 connected to the exhaust port 113*b*, and an exhaust mechanism 142 connected to the exhaust pipe 141. The exhaust mechanism 142 includes a vacuum pump, a pressure control valve and the like. During the processing, the gas in the processing container 108 reaches the exhaust duct 116 via the slit 113*a*, and is exhausted from the exhaust duct 116 through the exhaust pipe 141 by the exhaust mechanism 142.

The gas supply mechanism 105 supplies the processing gas into the processing container 108. The gas supply mechanism 105 includes a $WF_6$ gas source 151*a*, a hydrogen gas source 153*a*.

The $WF_6$ gas source 151*a* supplies a $WF_6$ gas, which is an example of a halogen-containing gas, into the processing container 108 via a gas supply line 151*d*. A flow rate controller 151*b* and a valve 151*c* are provided in the gas supply line 151*d* from the upstream side. The downstream side of the valve 151*c* in the gas supply line 151*d* is connected to the gas introduction hole 137. The supply and cutoff of the $WF_6$ gas into the processing container 108 are performed by the valve 151*c*.

The hydrogen gas source 153*a* supplies a hydrogen gas into the processing container 108 via a gas supply line 153*d*. A flow rate controller 153*b* and a valve 153*c* are provided in the gas supply line 153*d* from the upstream side. The downstream side of the valve 153*c* in the gas supply line 153*d* is connected to the gas introduction hole 136. The supply and cutoff of the hydrogen gas into the processing container 108 are performed by the valve 153*c*.

The controller 106 may be a computer, and includes a central processing unit (CPU), a random access memory (RAM), a read only memory (ROM), an auxiliary storage device, and the like. The CPU operates based on a program stored in the RAM, the ROM or the auxiliary storage device, and controls the operations of the processing apparatus 100. The controller 106 may be provided either inside or outside the processing apparatus 100. In the case where the controller 106 is provided outside the processing apparatus 100, the controller 106 is capable of controlling the processing apparatus 100 through a wired or wireless communication means.

<Selectivity>

Figure 3:
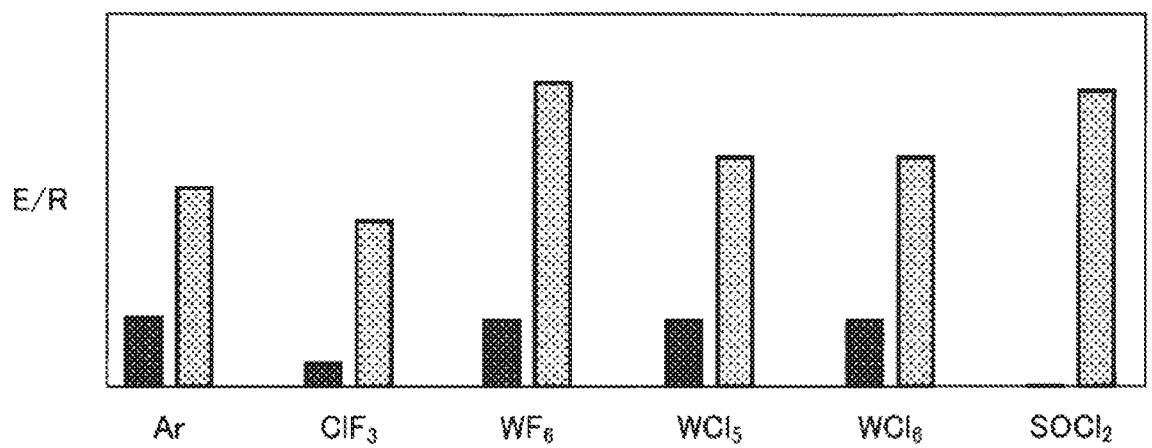
FIG. 3 is a view representing an example of the experimental results of selectivity in a surface processing according to an embodiment.
Figure 3:
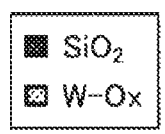

Next, the experimental results of selectivity at the time of the surface processing according to an embodiment will be described with reference to FIG. 3. FIG. 3 represents an example of the experimental results of an etching rate (E/R) when a silicon oxide film ($SiO_2$) and a tungsten oxide film are etched using the $WF_6$ gas, other halogen gases, or an argon gas supplied from the $WF_6$ gas source 151*a* illustrated in FIG. 2. The tungsten oxide film is an example of the metal oxide film. In this experiment, $ClF_3$, $WCl_5$, and $WCl_6$ gases were used as the other halogen gases.

In this experiment, an etching rate of a tungsten oxide film formed by a chemical vapor deposition (CVD) process and a silicon oxide film formed by a thermal oxidation process (ThOx) was measured. Specifically, an etched amount of the silicon oxide film was measured using a spectroscopic ellipsometer as a measurement device, and an etched amount of the tungsten oxide film was measured through an X-ray analysis (XPS, XRF). The XPS (X-ray photoelectron spectroscopy) is a measurement performed by an X-ray photoelectron spectroscopy method, and the XRF (X-ray fluorescence) is a measurement performed by an X-ray reflectance method. In this experiment, a plasma etching apparatus using a capacitively coupled plasma (CCP) was used for etching using the argon gas. A high-frequency power supply was connected to a lower electrode (stage) of the plasma etching apparatus. A high-frequency power of 13.56 MHz was applied to the lower electrode from the high-frequency power supply. In addition, the temperature of the stage was set to room temperature. When other gases of $ClF_3$, $WF_6$, $WCl_5$, $WCl_6$, and $SOCl_2$ were used, no plasma was used but a thermal reaction was used.

As a result of conducting experiments under the above conditions, as shown in the graph of FIG. 3, in the etching using each of the $ClF_3$, $WF_6$, $WCl_5$, and $WCl_6$ gases, the etching rate of the tungsten oxide film was at least three times that of the silicon oxide film. In addition, it can be seen that, in the etching using each of the $ClF_3$, $WF_6$, $WCl_5$, and $WCl_6$ gases, the etching rate of the tungsten oxide film to the silicon oxide film, namely the selectivity of the tungsten oxide film to the silicon oxide film, is higher than that of the etching using the argon gas.

Furthermore, as shown in the graph of FIG. 3, in the etching using an $SOCl_2$ (thionyl chloride) gas, which is an example of the halogen-containing gas, the silicon oxide film was not etched at all when the tungsten oxide film was etched by 1.85 nm. Therefore, it can be seen that, by using the $SOCl_2$ gas, it is possible to remove a tungsten oxide film 102a without changing the shape of the recess 113 of the insulating film 110 as the silicon oxide film.

In a physical etching through the sputtering of the argon gas, the selectivity is low. Thus, it is impossible to remove only the tungsten oxide film 102a, the shape of the recess 113 of the insulating film 110 as the silicon oxide film may be changed. In contrast, a chemical etching is promoted by using at least one of the $WF_6$, $WCl_5$, $WCl_6$, $ClF_3$, and $SOCl_2$ gases. Thus, the insulating film as the silicon oxide film is not etched and at least one of the $WF_6$, $WCl_5$, $WCl_6$, $ClF_3$, and $SOCl_2$ gases reacts with the tungsten oxide film etching. This makes it possible to perform etching with high selectivity. From the above, in the surface processing method according to the present embodiment, it is possible to remove the metal oxide film with high selectivity without etching the insulating film through the etching using at least one of the $ClF_3$, $WF_6$, $WCl_5$, $WCl_6$, and $SOCl_2$ gases.

<Surface Processing Method According to an Embodiment>

Figure 4:
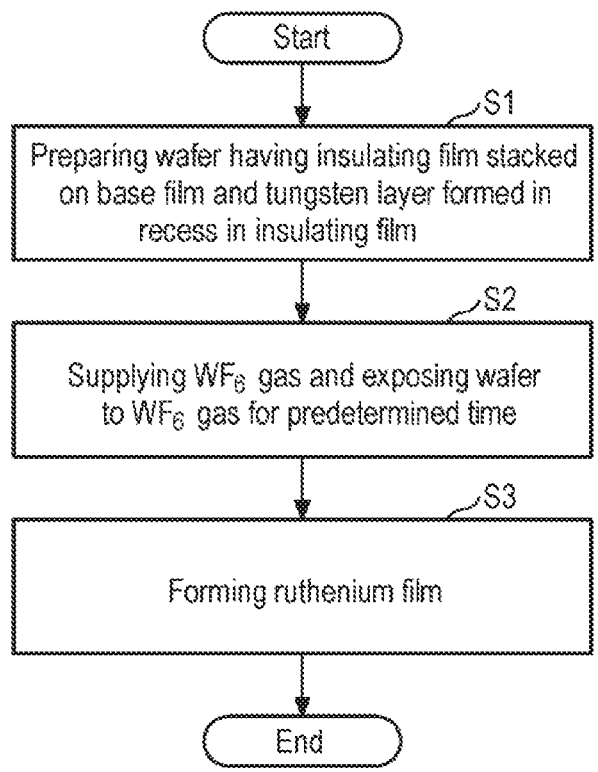
FIG. 4 is a flowchart illustrating an example of a surface processing according to an embodiment.
Figure 5C:
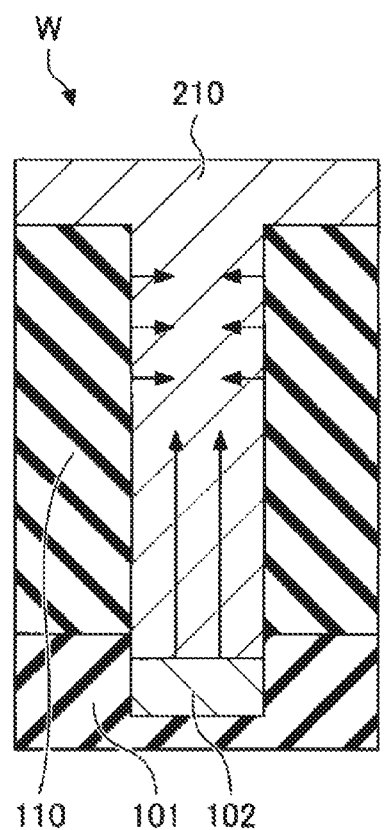

Accordingly, in the present embodiment, a metal oxide film is etched away by a halogen-containing gas with high selectivity. A surface processing method that includes removing a metal oxide film using the $WF_6$ gas, which is an example of a halogen containing gas, will be described with reference FIG. 4 and FIGS. 5A to 5C. FIG. 4 is a flowchart illustrating an example of the surface processing method according to an embodiment. FIGS. 5A to 5C are schematic cross-sectional views illustrating the wafer W supplied to the processing system.

As illustrated in FIG. 5A, the wafer W supplied to the processing system is formed by laminating an insulating film 110 on a base film 101. A metal layer of tungsten (hereinafter, referred to as a "tungsten layer 102") is formed on the base film 101. A surface layer of the tungsten layer 102 is naturally oxidized to form a tungsten oxide film 102a.

In the present embodiment, as illustrated in FIG. 4, first, the wafer W having the above structure is prepared (step S1). The wafer W is transferred into the processing container 108. Specifically, in the state in which the valves 151c and 153c of FIG. 2 are closed, the gate valve 112 is opened, and the wafer W is transferred into the processing container 108 by a transfer mechanism (not illustrated). The wafer W is placed on the stage 107 located at the transfer position. The transfer mechanism is withdrawn from the interior of the processing container 108, and subsequently, the gate valve 112 is closed. The stage 107 is moved up to the processing position to form the processing chamber 11. In addition, the internal pressure of the processing container 108 is adjusted to a predetermined pressure by the pressure control valve of the exhaust mechanism 142.

Returning back to FIG. 4, subsequently, the valve 151c is opened and the $WF_6$ gas is supplied from the $WF_6$ gas source 151a to the gas supply line 151d (step S2). At this time, since the valve 153c remains in the closed state, the $H_2$ gas is not supplied. Thus, the wafer W is exposed to the $WF_6$ gas in the processing chamber 11 so that the tungsten oxide film is removed.

After a predetermined period of time (e.g., 10 sec to 600 sec) elapses after the valve 151c is opened, the valve 151c is closed to stop the supply of the $WF_6$ gas. Thereafter, the wafer W is unloaded from the processing container 108 in the reverse procedure to that at the time of loading the wafer W into the processing container 108. The unloaded wafer W is loaded into the processing chamber 13 or the processing chamber 14 through the vacuum transfer chamber 20 kept at a vacuum. A ruthenium film is formed on the wafer W in the processing chamber 13 or the processing chamber 14 (step S3). Then, the process is terminated.

The surface processing method according to the present embodiment includes a step of providing the substrate having the metal layer in the bottom portion of the recess 113 formed in the insulating film 110 as illustrated in FIG. 5A, a step of supplying the halogen-containing gas into the processing chamber 11, and a step of removing the metal oxide film from the bottom portion of the recess 113 using the halogen-containing gas.

Although the processing apparatus 100 having the processing chamber 11 has been described, the processing apparatus may have a configuration that is the same as or different from that of the processing apparatus having the processing chambers 12 to 14.

The insulating film 110 formed on the base film 101 as illustrated in FIGS. 5A to 5C may be a silicon-containing film, such as a silicon oxide film, a silicon film, a silicon nitride film or the like. However, the insulating film 110 is not limited to a single-layer film such as the silicon oxide film, the silicon film, or the silicon nitride film, and may be any of stacked films obtained by combining different silicon-containing films with each other, such as a stacked film of the silicon oxide film and the silicon nitride film. The recess 113, such as a trench, a via hole, or a contact hole, is formed in the insulating film 110. The tungsten layer 102 is exposed from the bottom portion of the recess 113. Thus, the surface of the tungsten layer 102 is naturally oxidized to form the tungsten oxide film 102a.

Process conditions used in the step of removing the tungsten oxide film 102a illustrated in step S2 of FIG. 4 are as follows.

(Process Conditions in Tungsten Oxide Film Removal Step)

Gas: at least one of $WF_6$, $WCl_5$, $WCl_6$, $ClF_3$, and $SOCl_2$

Wafer temperature: for $WF_6$, $WCl_5$, $WCl_6$, 400 degrees C. or higher for $ClF_3$, 200 degrees C. or lower for $SOCl_2$, 100 to 300 degrees C.

Time period: 10 to 600 sec

FIG. 5B is a schematic cross-sectional view illustrating the wafer W after the tungsten oxide film 102a is removed. In the step of removing the tungsten oxide film 102a illustrated in step S2 of FIG. 4, the tungsten oxide film 102a is removed by performing the chemical etching using the halogen-containing gas having a high selectivity of the tungsten oxide film 102a relative to the insulating film 110. This makes it possible to etch the tungsten oxide film 102a with high selectivity.

For example, in the sputtering as a physical reaction, the shape of the recess 113 such as a trench, a via hole, or a contact hole may be collapsed. In the recent fine process, the collapse of the shape has a great influence on the process. Thus, fine shape accuracy is required for the process. In the surface processing method according to the present embodiment, it is possible to effectively remove the tungsten layer 102 using the halogen-containing gas with high selectivity while maintaining the shape of the recess 113 through the high selectivity chemical etching based on the halogen-containing gas. From the above experimental results, it is preferable to use at least one of the $WF_6$, $WCl_5$, $WCl_6$, $ClF_3$, and $SOCl_2$ gases as the halogen-containing gas in the step of removing the tungsten oxide film 102a.

The step of removing the tungsten oxide film 102a is a chemical reaction-based etching process. For example, when the $WF_6$ gas is supplied as a halogen-containing gas, oxygen atoms in the tungsten oxide film 102a and tungsten (W) in the $WF_6$ gas are combined with each other to produce tungsten oxyfluoride ($W-F-O_x$). The tungsten oxyfluoride thus produced is a volatile gas, and thus is released outward of the recess 113. This makes it possible to remove the tungsten oxide film 102a.

Meanwhile, the insulating film 110 as a silicon oxide film is less likely to be etched than the tungsten oxide film 102a due to the selectivity shown in FIG. 3. In the present embodiment, the step of removing the tungsten oxide film 102a performs a thermal reaction-based process without having to use plasma. This makes it possible to remove the tungsten oxide film 102a without collapsing the shape of the insulating film 110.

In the step of removing the tungsten oxide film 102a, in the case where the $SOCl_2$ gas is used and impurities caused by the $SOCl_2$ gas remains on the surface of the tungsten layer 102, a subsequent step of removing the impurities may be performed prior to the step of embedding ruthenium. The subsequent step of removing the impurities may be an example of a process that includes supplying the $H_2$ gas, reducing the impurities caused by the $SOCl_2$ gas into hydrogens, and volatilizing away the hydrogens, but is not limited thereto.

After the tungsten oxide film 102a is removed in the processing chamber 11, the wafer W is transferred to the processing chamber 13 or the processing chamber 14. The process of the ruthenium embedding step is performed in the processing chamber 13 or the processing chamber 14 (see FIG. 1). Here, an example in which the process of the ruthenium embedding step is performed in the processing chamber 13 will be described.

A CVD apparatus or the like may be used as the processing chamber 13 which performs the process of the ruthenium embedding step. First, a ruthenium-containing gas is supplied into the processing chamber 13 into which the wafer W has been loaded. For example, dodecacarbonyl triruthenium ($Ru_3(CO)_{12}$) is supplied into the processing chamber 13, and the wafer W placed on the stage 13a is heated by the heater embedded in the stage 13a.

The $Ru_3(CO)_{12}$ adsorbed onto the surface of the wafer W undergoes a thermal decomposition so that a ruthenium film is formed on the wafer W. Here, in the film forming method based on the thermal decomposition of $Ru_3(CO)_{12}$, a film forming rate at the surface of the tungsten layer 102 is higher than that at the side surface of the insulating film 110 as the silicon oxide film formed in the recess 113.

Thus, ruthenium is embedded from the bottom portion of the recess 113 in a bottom-up manner to form a ruthenium-embedded portion. This makes it possible to embed ruthenium from the bottom portion of the recess 113 in a bottom-up manner, and to suppress the generation of voids and seams.

FIG. 5C is a schematic cross-sectional view illustrating the wafer W after the ruthenium embedding step is completed. In the ruthenium embedding step, as indicated by long arrows in FIG. 5C, a ruthenium-embedded portion 210 is formed from the bottom portion of the recess 113 in a bottom-up manner. In addition, as indicated by short arrows in FIG. 5C, a ruthenium film is also gradually formed on side surfaces of the recess 113. In this manner, the ruthenium film is gradually formed in a conformal manner while suppressing the occurrence of voids and seams, so that the ruthenium-embedded portion 210 embedded in the entire recess 113 is formed. In the ruthenium embedding step, in the case of forming the ruthenium-embedded portion 210 using $Ru_3(CO)_{12}$, the temperature of the stage may be controlled to about 100 to 250 degrees C.

Although the ruthenium embedding step has been described to be performed using $Ru_3(CO)_{12}$, the ruthenium-containing gas is not limited to $Ru_3(CO)_{12}$. For example, a gas containing $Ru_3(CO)_{12}$ (but not containing oxygen gas), (2,4-dimethylpentadienyl)(ethylcyclopentadienyl)ruthenium: (Ru(DMPD)(EtCp)), bis(2,4-dimethylpentadienyl) Ruthenium: (Ru(DMPD)$_2$), 4-dimethylpentadienyl(methylcyclopentadienyl)Ruthenium: (Ru(DMPD)(MeCp)), Bis(Cyclopentadienyl)Ruthenium: (Ru($C_5H_5$)$_2$). Cis-dicarbonylbis(5-methylhexane-2,4-dionate)ruthenium(II), or bis(ethylcyclopentadienyl)Ruthenium(II): Ru(EtCp)$_2$ may be used as the ruthenium-containing gas.

In the ruthenium embedding step according to an embodiment, a ruthenium film forming method in which oxygen gas is not used as a gas supplied to the processing chamber 13 may be used. This makes it possible to prevent the surface of the tungsten layer 102 on the bottom portion of the recess 113 from being oxidized again by the oxygen gas.

<Surface Processing Method According to Modification>

Next, a surface processing method according to a modification of the embodiment will be described with reference to FIG. 6 and FIGS. 7A to 7D. FIG. 6 is a flowchart illustrating an example of the surface processing method according to an embodiment. FIGS. 7A to 7D are schematic cross-sectional views of the wafer, illustrating a surface processing and respective steps of a film forming method according to the modification of the embodiment.

In this modification, after the step of removing the tungsten oxide film 102a, a step of forming a tungsten film on the bottom portion of the recess 113 using a halogen-containing gas and a hydrogen gas is performed, and subsequently, a step of embedding ruthenium in the recess 113 is performed.

In this modification, after the tungsten oxide film 102a is removed in the processing chamber 11 of the processing apparatus 100 of FIG. 2, a tungsten film is formed using an atomic layer deposition (ALD) method in the same processing chamber 11.

The surface processing method including the step of removing a tungsten oxide film according to this modification will be described with reference to FIG. 6. In this modification, first, as illustrated in FIG. 7A, a wafer W in which an insulating film 110 is stacked on a base film 101 and a tungsten layer 102 is formed in a recess 113 of the insulating film 110 is provided (step S11). The wafer W is loaded into the processing container 108.

Subsequently, the valve 151c is opened, and the $WF_6$ gas is supplied from the $WF_6$ gas source 151a to the gas supply line 151d (step S12). At this time, since the valve 153c remains in the closed state, the $H_2$ gas is not supplied. Thus, the wafer W is exposed to the $WF_6$ gas in the processing chamber 11 to remove a tungsten oxide film 102a.

Subsequently, after a predetermined period of time elapses after the valve 151c is opened, the $WF_6$ gas and the $H_2$ gas are supplied into the processing container 108 by alternately opening and closing the valve 151c and the valve 153c (step S13). Thus, the wafer W is alternately exposed to the $WF_6$ gas and the $H_2$ gas in the processing chamber 11 so that a tungsten film is formed.

Subsequently, it is determined whether or not the film formation of the tungsten film is completed (step S14). When a film formation time elapses, it is determined that the film formation of the tungsten layer is completed, and the valves 151c and 153c are closed to stop the supply of the $WF_6$ gas and the $H_2$ gas. Thus, on the tungsten layer 102 from which the tungsten oxide film 102a has been removed, a tungsten layer having a predetermined film thickness corresponding to the removed portion is formed. Thus, it is possible to repair the upper surface of the tungsten layer 102 to restore the shape thereof.

FIG. 7C is a schematic cross-sectional view of the wafer W after the tungsten film forming step. By performing the tungsten film forming step, a tungsten layer 102' having a predetermined film thickness corresponding to the removed portion is formed on the tungsten layer 102. Thus, in the ruthenium film forming step as a subsequent step, it is possible to form a ruthenium film on the tungsten layer 102' in a bottom-up manner without changing the shape of the bottom portion of the recess 113 after the tungsten oxide film 102a is removed.

Thereafter, the wafer W is unloaded from the processing container 108 in the reverse procedure to that at the time of loading the wafer W into the processing container 108. The unloaded wafer W is loaded into the processing chamber 13 or the processing chamber 14 through the vacuum transfer chamber 20 without breaking the vacuum. The ruthenium film is formed on the wafer W in the processing chamber 13 or the processing chamber 14 (step S15). This process is terminated.

In step S14 of FIG. 6, instead of the film forming time, a film thickness of the formed tungsten layer 102 may be measured. If it is determined that the film thickness reaches a predetermined value or more, control may be performed to stop the supply of the $WCl_6$ gas and the $H_2$ gas.

Process conditions used in the tungsten film forming step are as follows.

(Process Conditions in Tungsten Film Forming Step)
Gas: at least one of $WF_6$, $WCl_5$, and $WCl_6$, and $H_2$ gases Wafer temperature: for $WF_6$, $WCl_5$, or $WCl_6$, 400 degrees C. or higher
Time period: 10 sec to 600 sec In the tungsten film forming step, the film forming process using the ALD method is performed, and plasma is not used. Thus, it is possible to form the tungsten layer 102 without collapsing the shape of the insulating film 110, thereby returning the shape of the bottom portion of the recess 113 to the original state thereof.

The process including the step of removing the tungsten oxide film 102a and the step of forming the tungsten film may be performed in different processing chambers, but it is preferable to execute the process in the same processing chamber 11. The reason is that in an etching process used in the step of removing the tungsten oxide film 102a, a fluorine-containing substance may remain in the processing chamber 11 as a reaction product generated during the etching process. Therefore, by performing the process of the tungsten film forming step in the same processing chamber 11, it is possible to cause the hydrogen gas and the fluorine-containing substance to react with each other, and discharge them. It is possible to remove the fluorine-containing substance in the processing chamber 11 while executing the tungsten film forming step. Furthermore, by performing the process including the two steps in the same processing chamber 11, it is possible to eliminate a period of transfer time and to enhance productivity.

The halogen-containing gas used in the step of removing the tungsten oxide film 102a and the halogen-containing gas used in the step of forming the tungsten film may be the same gas. For example, by using any one of $WF_6$, $WCl_5$, and $WCl_6$ gases which are tungsten halides, in the step of removing the tungsten oxide film 102a, the same gas may also be used in the step of forming the tungsten film. This further improves productivity. When the $ClF_3$ gas is used in the step of removing the tungsten oxide film 102a, the $ClF_3$ gas may also be used in a step of cleaning the processing container 108.

In some embodiments, in order to diffuse the halogen-containing gas to the bottom portion of the recess 113, a tank may be provided at the upstream side of the valve 151c. The halogen-containing gas may be stored in the tank. The valve 151c may be opened to discharge the halogen-containing gas having an increased pressure.

In some embodiments, in order to diffuse the hydrogen gas to the bottom portion of the recess 113, a tank may be provided at the upstream side of the valve 153c. The hydrogen gas may be stored in the tank. The valve 153c may be opened to discharge the hydrogen gas having an increased pressure.

As described above, with the surface processing method according to the embodiment, it is possible to remove the metal oxide film with high selectivity. With the processing system according to the embodiment, it is possible to continuously perform the step of removing the tungsten oxide film 102a and the step of embedding ruthenium on the wafer W without breaking the vacuum while respective processes are performed on the wafer W in the respective processing chambers. With the processing system according to the modification of the embodiment, it is possible to continuously perform the step of removing the tungsten oxide film 102a, the step of forming the tungsten film and the step of embedding ruthenium on the wafer W without breaking the vacuum while respective processes are performed on the wafer W in the respective processing chambers. Furthermore, it is possible to perform the step of removing the tungsten oxide film 102a and the step of forming the tungsten film in the same processing chamber.

In the foregoing, the embodiments of the present disclosure have been described in detail. However, the present disclosure is not limited to the embodiments described above. In the embodiments described above, various modifications, substitutions or the like may be applicable without departing from the scope of the present disclosure. In addition, the matters described in the aforementioned embodiments may be combined unless a conflict arises.

The number of processing chambers 11 to 14, the number of vacuum transfer chambers 20, the number of load-lock chambers 31 and 32, the number of atmospheric transfer chambers 40, the number of load ports 51 to 53, and the number of gate valves 61 to 68 are not limited to those illustrated in FIG. 1, but may be any number. Although the ruthenium embedding step has been described to be performed in the processing chambers 13 and 14 in the processing system, the ruthenium embedding step may be performed in the processing chambers 12 to 14. It is possible to improve productivity by performing ruthenium embedding steps on different wafers in parallel using a plurality of processing chambers. In addition, the processing chamber 12 may be used as a processing chamber in which the step of removing the metal oxide film is performed like the processing chamber 11. From the viewpoint of productivity, the number of processing apparatuses that perform the metal oxide film removing step and the ruthenium embedding step may be arbitrarily set in view of the system configuration.

That is to say, the number of processing chambers of the present disclosure may be one, but may be preferably two or more. The processing chambers of the present disclosure may include a first processing chamber in which a step of removing, from a substrate having a metal layer formed in a bottom portion of a recess formed in an insulating film, a metal oxide film on a surface of the metal layer, is performed, and a second processing chamber in which a step of embedding ruthenium from the bottom portion of the recess is performed. The processing chambers of the present disclosure may include the first processing chamber, the second processing chamber, and a third processing chamber in which a step of forming a tungsten film on the metal layer is performed.

Any of a capacitively coupled plasma (CCP) type, an inductively coupled plasma (ICP) type, a radial line slot antenna (RLSA) type, an electron cyclotron resonance plasma (ECR) type, and a helicon wave plasma (HWP) type is applicable to the processing chambers of the present disclosure.

According to an aspect, it is possible to provide a surface processing method and a processing system which are capable of removing a metal oxide film with high selectivity.

What is claimed is:

1. A method of performing a surface processing on a substrate having a metal layer formed on a bottom portion of a recess formed in an insulating film, the method comprising:

supplying a halogen-containing gas into a processing chamber in which the substrate is loaded;

removing a metal oxide film from the bottom portion of the recess using the halogen-containing gas; and after the removing the metal oxide film, forming a metal film on the bottom portion of the recess by alternately supplying the halogen-containing gas and a hydrogen gas into the processing chamber, wherein in the forming the metal film, a halogen-containing substance, which has remained in the processing chamber as a reaction product generated during the removing the metal oxide film, is reacted with the hydrogen gas, and is removed, wherein the metal oxide film is a tungsten oxide film, and the metal film is a tungsten film, and wherein the halogen-containing gas is $WF_6$, and the halogen-containing substance is a fluorine-containing substance.

2. The method of claim 1, wherein the metal layer is made of tungsten.

3. The method of claim 1, wherein the insulating film is a silicon-containing film.

4. The method of claim 3, wherein the silicon-containing film is at least one of a silicon oxide film and a silicon nitride film.

5. The method of claim 1, further comprising: supplying a gas containing ruthenium toward the bottom portion of the recess to embed the ruthenium from the bottom portion of the recess.

6. The method of claim 5, wherein the embedding the ruthenium is performed without having to use an oxygen gas.

7. The method of claim 5, wherein the ruthenium-containing gas is any of a gas containing $Ru_3(CO)_{12}$, (2,4-dimethylpentadienyl)(ethylcyclopentadienyl)ruthenium; (Ru(DMPD)(EtCp)), bis(2,4-dimethylpentadienyl)Ruthenium: (Ru(DMPD)$_2$), 4-dimethylpentadienyl(methylcyclopentadienyl)Ruthenium: (Ru(DMPD)(MeCp)), Bis(Cyclopentadienyl)Ruthenium: (Ru(C$_5$H$_5$)$_2$), Cis-dicarbonylbis(5-methylhexane-2,4-dionate)ruthenium(II), and bis(ethylcyclopentadienyl)Ruthenium(II): Ru(EtCp)$_2$.

8. The method of claim 5, wherein the removing the metal oxide film to the embedding the ruthenium are continuously performed without exposing the substrate to air.

9. The method of claim 1, wherein the removing the metal oxide film and the forming the metal film on the bottom portion of the recess are performed in a same processing chamber.

10. The method of claim 1, wherein the removing the metal oxide film is performed using a chemical etching method in which no plasma is used.

11. The method of claim 9, wherein the forming the metal film on the bottom portion of the recess is performed using an atomic layer deposition method in which no plasma is used.

* * * * *